US006607976B2

(12) United States Patent
Chen et al.

(10) Patent No.: US 6,607,976 B2
(45) Date of Patent: Aug. 19, 2003

(54) COPPER INTERCONNECT BARRIER LAYER STRUCTURE AND FORMATION METHOD

(75) Inventors: Ling Chen, Sunnyvale, CA (US); Seshadri Ganguli, Sunnyvale, CA (US); Christophe Marcadal, Santa Clara, CA (US); Wei Cao, Milpitas, CA (US); Roderick C. Mosely, Pleasanton, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/964,108

(22) Filed: Sep. 25, 2001

(65) Prior Publication Data

US 2003/0059980 A1 Mar. 27, 2003

(51) Int. Cl.⁷ .......................................... H01L 21/4763
(52) U.S. Cl. ..................... 438/627; 438/648; 438/656; 438/680; 438/687
(58) Field of Search ............................... 438/627, 648, 438/656, 672, 680, 687

(56) References Cited

U.S. PATENT DOCUMENTS

| | | |
|---|---|---|
| 5,429,989 A | 7/1995 | Fiordalice et al. |
| 5,789,312 A | 8/1998 | Buchanan et al. |

(List continued on next page.)

OTHER PUBLICATIONS

Creighton "Non–selective Tungsten Chemical–vapor Deposition Using Tungsten Hexacarbonyl," *Deposition and Growth: Limits for Microelectronics* American Institution of Physics Conference Proceedings 167:192–201(1988).

(List continued on next page.)

*Primary Examiner*—T. N. Quach
(74) *Attorney, Agent, or Firm*—Townsend and Townsend and Crew

(57) ABSTRACT

A method for forming a tungsten-containing copper interconnect barrier layer (e.g., a tungsten [W] or tungsten-nitride [$W_XN$] copper interconnect barrier layer) on a substrate with a high (e.g., greater than 30%) sidewall step coverage and ample adhesion to underlying dielectric layers. The method includes first depositing a thin titanium-nitride (TiN) or tantalum nitride (TaN) nucleation layer on the substrate, followed by the formation of a tungsten-containing copper interconnect barrier layer (e.g., a W or $W_XN$ copper interconnect barrier layer) overlying the substrate. The tungsten-containing copper interconnect barrier layer can, for example, be formed using a Chemical Vapor Deposition (CVD) technique that employs a fluorine-free tungsten-containing gas (e.g., tungsten hexacarbonyl [$W(CO)_6$]) or a $WF_6$-based Atomic Layer Deposition (ALD) technique. The presence of a thin TiN (or TaN) nucleation layer facilitates the formation of a tungsten-containing copper interconnect barrier layer with a sidewall step coverage of greater than 30% and ample adhesion to dielectric layers. A copper interconnect barrier layer structure includes a thin titanium-nitride (TiN) (or tantalum nitride [TaN]) nucleation layer disposed directly on the dielectric substrate (e.g., a single or dual-damascene copper interconnect dielectric substrate). The copper interconnect barrier layer structure also includes a tungsten-containing copper interconnect barrier layer (e.g., a W or $W_XN$ copper interconnect barrier layer) formed on the thin TiN (or TaN) nucleation layer using, for example, a CVD technique that employs a fluorine-free tungsten-containing gas (e.g., [$W(CO)_6$]) or a $WF_6$-based ALD technique.

14 Claims, 4 Drawing Sheets

U.S. PATENT DOCUMENTS

| | | | | |
|---|---|---|---|---|
| 5,972,179 A | * | 10/1999 | Chittipeddi et al. | ... 204/192.17 |
| 5,989,623 A | | 11/1999 | Chen et al. | ... 427/97 |
| 6,091,122 A | | 7/2000 | Buchanan et al. | |
| 6,107,199 A | | 8/2000 | Allen et al. | |
| 6,130,145 A | | 10/2000 | Ilg et al. | |
| 6,143,641 A | | 11/2000 | Kitch | ... 438/618 |
| 6,177,670 B1 | | 1/2001 | Sugiyama | |
| 6,184,138 B1 | | 2/2001 | Ho et al. | ... 438/687 |
| 6,191,029 B1 | | 2/2001 | Hsiao et al. | ... 438/633 |
| 6,207,222 B1 | | 3/2001 | Chen et al. | ... 438/628 |
| 6,432,821 B1 | * | 8/2002 | Dubin et al. | ... 438/678 |
| 6,455,421 B1 | * | 9/2002 | Itoh et al. | ... 438/656 |

OTHER PUBLICATIONS

Kaplan et al. "The Deposition of Molybdenum and Tungsten Films from Vapor Decomposition of Carbonyls," J. Electrochem. Soc. 117:693–700 (1970).

Kelsey, Jean E., et al., "Low Temperature Metal–Organic Chemical Vapor Deposition of Tungsten Nitride as Diffusion Barrier for Copper Metallization," J. Vac. Sci. Technol. B 17(3), May/Jun. 1999, pp. 1101–1104, 2193 and Fig.

Nanda, Arun K., et al., "Characterization of the Nucleation and Growth Process of CVD–W on TiN Substrates," Mat. Res. Soc. Symp. Proc. vol. 382, 1995 Materials Research Society, pp. 401–406.

Rutten, Mathew, et al., "Failure of Titanium Nitrade Diffusion Barriers During Tungsten Chemical Vapor Deposition: Theory and Practice," Conference Proceedings ULSI–V11, 1992 Materials Research Society, pp. 277–283.

Kobayashi, Nobuyoshi, et al, "Study on Mechanism of Selective Chemical Vapor Deposition of Tungsten Using In Situ Infrared Spectroscopy and Auger Electron Spectroscopy," J. Appl. Phys. 69 (2), Jan. 15, 1991, pp. 1013–1019.

Parikh, S., et al., "TiN Barrier Intergrity and Volcano Formation in W–Plug Applications," Thin Solid Films 320 (1998) pp. 26–30.

Ramanath, G., et al., "W Deposition and Titanium Fluoride Formation During WF6 Reduction by TI: Reaction Path and Mechanisms," Journal of Applied Physics, vol. 85, No. 3, Feb. 1, 1999, pp. 1961–1969.

Ramanath, G., et al., "Gas–Phase Transport of WF6 Through Annular Nanopipes in T1N/Ti/Si02 Structures for Integrated Circuit Fabrication," Appl. Phys. Lett. 69 (21), Nov. 18, 1996, pp. 3179–3181.

* cited by examiner

US 6,607,976 B2

COPPER INTERCONNECT BARRIER LAYER STRUCTURE AND FORMATION METHOD

BACKGROUND OF THE INVENTION

The use of single and dual-damascene copper interconnect structures in semiconductor device manufacturing has received a great deal of attention due to the decreased resistivity of copper interconnects in comparison to aluminum interconnects. In typical single and dual-damascene copper interconnect structures, a tantalum (Ta) or tantalum-nitride (TaN) copper interconnect barrier layer is employed to prevent the undesirable diffusion of copper into, for example, a dielectric layer. A conventional copper interconnect structure formation process includes first depositing a tantalum or tantalum-nitride copper interconnect barrier layer on a substrate (e.g., a single or dual-damascene dielectric substrate) using Physical Vapor Deposition (PVD), followed by the deposition of a copper seed layer. A bulk copper layer is subsequently formed on the copper seed layer by electroplating.

In the field of semiconductor device manufacturing, deposition processes can be characterized by sidewall step coverage and aspect ratio. Sidewall step coverage is defined as the ratio of a layer's thickness on the sidewall of a feature to that on a horizontal surface adjacent to the feature and is generally expressed as a percentage. Aspect ratio is defined as the height of a feature (e.g., a via or trench) versus the width of the feature. A drawback of the conventional copper interconnect process described above is the low sidewall step coverage obtained for Ta and TaN copper interconnect barrier layers formed using PVD techniques. For high aspect ratio via and trench features (e.g., aspect ratios of 4:1 and greater), the sidewall step coverage obtained with PVD techniques is typically around 10%. Tungsten-nitride ($W_xN$) layers deposited using Chemical Vapor Deposition (CVD) have been investigated as potential copper interconnect barrier layers. $W_xN$ layers deposited by CVD, however, can also suffer from undesirably low sidewall step coverage, as well as from poor adhesion to underlying dielectric layers.

Still needed in the field, therefore, is a method for forming a copper interconnect barrier layer with a high sidewall step coverage (i.e., a sidewall step coverage of greater than 30% to conformal) and ample adhesion to an underlying dielectric layer. Also needed is a copper interconnect barrier structure that includes a copper interconnect barrier layer with a high sidewall step coverage.

SUMMARY OF THE INVENTION

The present invention provides a method for forming a tungsten-containing copper interconnect barrier layer (e.g., a tungsten [W] or tungsten-nitride [$W_xN$] copper interconnect barrier layer) on a substrate with a high (e.g., greater than 30%) sidewall step coverage. The method also results in ample adhesion of the tungsten-containing copper interconnect barrier layer to any underlying dielectric layers.

A process according to one exemplary embodiment of the present invention includes first depositing, on a substrate, a thin titanium-nitride (TiN) or tantalum nitride (TaN) nucleation layer, followed by the formation of a tungsten-containing copper interconnect barrier layer (e.g., a W or $W_xN$ copper interconnect barrier layer) thereon. The tungsten-containing copper interconnect barrier layer can be formed, for example, using a CVD technique that employs a fluorine-free tungsten-containing gas (e.g., tungsten hexacarbonyl $W[CO]_6$). Alternatively, the tungsten-containing copper interconnect barrier layer can be formed using a $WF_6$-based Atomic Layer Deposition (ALD) technique.

The presence of a thin TiN (or TaN) nucleation layer on the substrate facilitates formation of a tungsten-containing copper interconnect barrier layer with a sidewall step coverage of greater than 30%. In addition, for the circumstance of a dielectric substrate (e.g., a single or dual-damascene copper interconnect substrate), the presence of the thin TiN nucleation layer on the dielectric substrate enables ample adhesion of the tungsten-containing copper interconnect barrier layer to the dielectric substrate.

Exemplary embodiments of a copper interconnect barrier layer structure according to the present invention includes either a thin titanium-nitride (TiN) nucleation layer or a thin tantalum-nitride (TaN) nucleation layer disposed directly on a dielectric structure (e.g., a single or dual-damascene copper interconnect dielectric structure). The copper interconnect barrier layer structure also includes a tungsten-containing copper interconnect barrier layer (e.g., a W or $W_xN$ copper interconnect barrier layer) formed on the thin TiN (or TaN) nucleation layer using, for example, a CVD technique that employs a fluorine-free tungsten-containing gas (e.g., tungsten hexacarbonyl ($W[CO]_6$) or a $WF_6$-based ALD technique.

A better understanding of the features and advantages of the present invention will be obtained by reference to the following detailed description that sets forth illustrative embodiments, in which the principles of the invention are utilized, and the accompanying drawings (in which like numerals are used to designate like elements).

DETAILED DESCRIPTION OF THE INVENTION

Figure 1A:
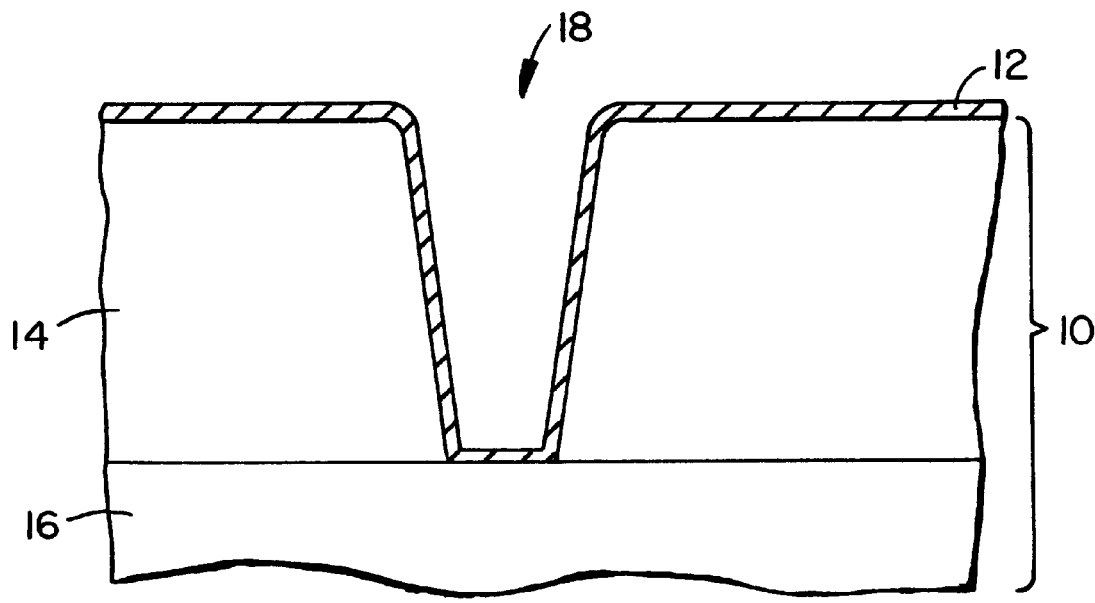
FIGS. 1A–1C are simplified cross-sectional diagrams of a substrate as it is subjected to a sequence of steps in a process according to one exemplary embodiment of the present invention.

FIGS. 1A–1C and FIG. 2 are simplified cross-sectional diagrams of a substrate and a flow chart, respectively, illustrating a sequence of steps in a process for forming a copper interconnect barrier layer on a substrate 10 in accordance with an exemplary embodiment of the present invention. A thin titanium-nitride (TiN) nucleation layer 12 is first deposited on substrate 10, as shown in FIG. 1A and charted in step 50 of FIG. 2. Thin TiN nucleation layer 12 is referred to as a "nucleation" layer since it serves to promote (e.g., by serving as a growth site) the subsequent formation of a tungsten-containing copper interconnect barrier layer (described in further detail below) thereon.

Substrate 10 can be any substrate employed in copper interconnect technology. For example, substrate 10 can be a single or dual-damascene copper interconnect substrate that includes a dielectric layer with a trench and/or via formed therein. Substrate 10 is depicted in FIG. 1A as including a dielectric layer 14 (e.g., a silicon dioxide [$SiO_2$] layer or a low-k dielectric layer) overlying a metal layer 16 (e.g., a copper layer). Dielectric layer 14 is also depicted in FIGS. 1A–1C as having a via and/or trench opening 18 formed therein.

The thickness of thin TiN nucleation layer 12 is predetermined to improve nucleation and, therefore, superior sidewall step coverage (i.e., greater than 30%) of the subsequently formed tungsten-containing copper interconnect barrier layer. The thickness (measured on the sidewall of via and/or trench opening 18) can be, for example, in a range from 3 angstroms to 50 angstroms. A thickness in the range of 3 angstroms to 10 angstroms can, however, minimize deposition time, as well as the combined thickness of thin TiN nucleation layer 12 and the subsequently formed tungsten-containing copper interconnect barrier layer.

Thin TiN nucleation layer 12 can be deposited by conventional techniques, such as the thermal decomposition of a titanium and nitrogen-containing precursor (e.g., tetra-dimethyl-amino-titanium [TDMAT] or tetra-diethyl-amino-titanium [TDEAT]). In an alternative embodiment, a thin tantalum-nitride (TaN) nucleation layer is deposited on substrate 10m instead of TiN layer 12. Such a thin TaN nucleation layer can be deposited by conventional techniques, such as the thermal decomposition of a tantalum and nitrogen-containing precursor (e.g., penta-dimethyl-amino-tantalum [PDMAT] or penta-ethyl-methylamino-tantalum [PEMAT]). Conventional techniques for the deposition of a thin TiN nucleation layer using the thermal decomposition of TDMAT can be conducted at, for example, a temperature in the range of 300° C. to 450° C. and a pressure in the range of 0.1 Torr to 50 Torr. The thin TiN nucleation layer can also be deposited using an Atomic Layer Deposition (ALD) technique employing TDMAT (or, alternatively, TDEAT) and $NH_3$. Such an ALD technique is conducted using an alternating exposure of substrate 10 to TDAT (or TDEAT) and $NH_3$ at a temperature in the range of 100° C. to 350° C. and a pressure in the range of 0.1 Torr to 50 Torr. Similarly, conventional techniques for the deposition of a thin TaN nucleation layer using the thermal decomposition of PDMAT or PEMAT can be conducted. The thin TaN can also be deposited using an ALD technique employing PDMAT or PEMAT.

Figure 1B:
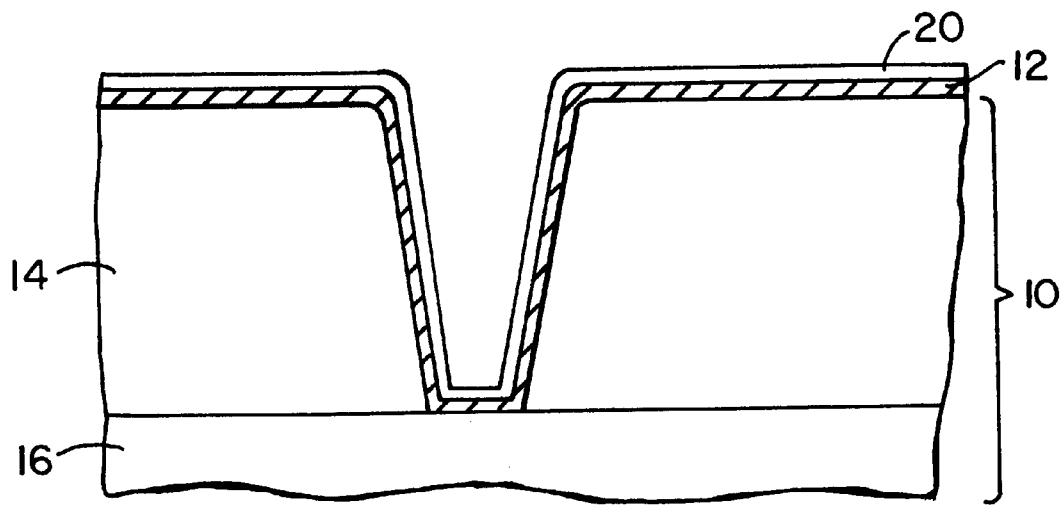
Figure 1C:
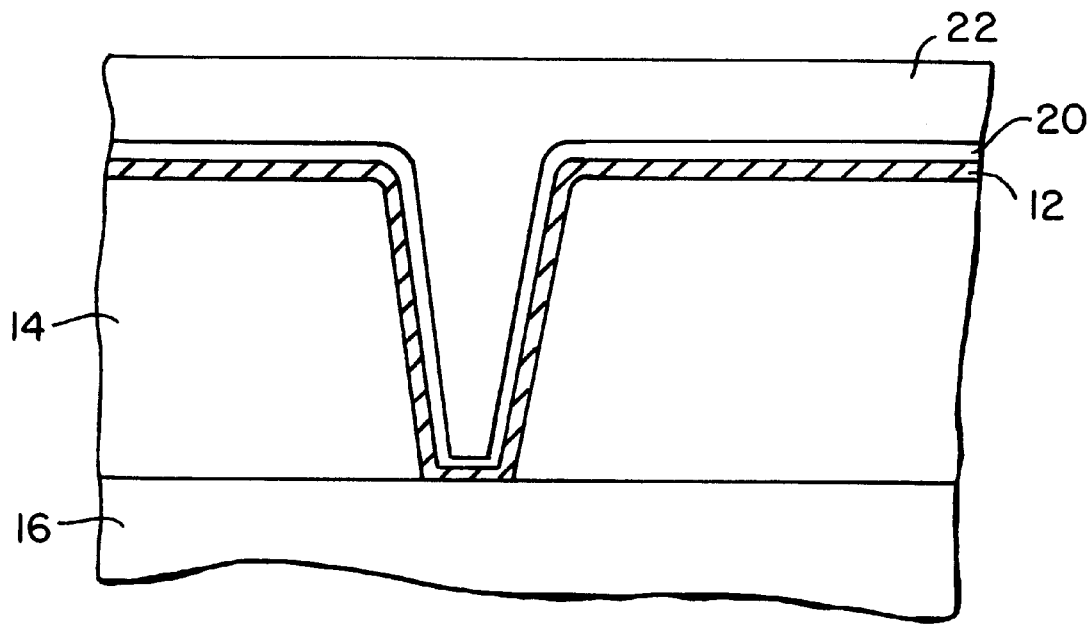
Figure 2:
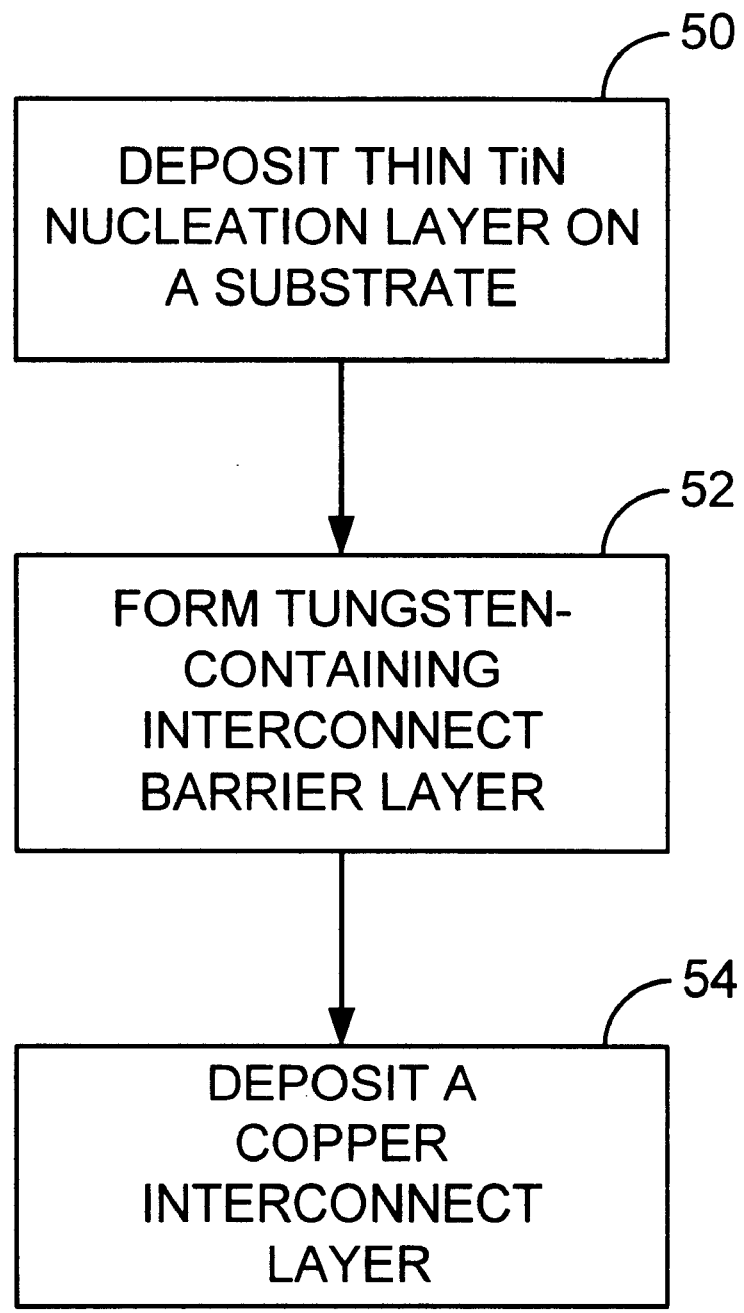
FIG. 2 is a flow chart illustrating the process to which the substrate shown in FIGS. 1A–1C is subjected.

Next, a tungsten-containing copper interconnect barrier layer 20 is formed on thin TiN nucleation layer 12, as illustrated in FIG. 1B (see also step 52 of FIG. 2). In one embodiment, tungsten-containing copper interconnect barrier layer 20 can be beneficially formed using a Chemical Vapor Deposition (CVD) technique that employs a fluorine-free tungsten-containing gas (e.g., tungsten hexacarbonyl $W(CO)_6$). This embodiment employs a fluorine-free tungsten-containing gas is employed to avoid fluorine-induced corrosion of either copper layers in substrate 10 or subsequently deposited copper layers. In this embodiment, tungsten-containing copper interconnect barrier layer 20 can be a tungsten (W) copper interconnect barrier layer formed using a CVD technique that employs $W(CO)_6$ or a tungsten-nitride ($W_xN$) copper interconnect barrier layer formed using a CVD technique that employs $W(CO)_6$ and ammonia ($NH_3$). W and $W_xN$ layers are generally known in the field to be good barriers against the diffusion of copper. In addition, it has been determined that techniques for the formation of a tungsten (W) copper interconnect barrier layer employing $W(CO)_6$ and conducted at a temperature in the range of 300° C. to 500° C., a pressure in the range of 10 milli-Torr to 200 milli-Torr and with a $W(CO)_6$ flow rate in the range of 2 sccm to 20 sccm result in a sidewall step coverage of greater than 30% for features with an aspect ratio of 4:1 and greater when utilized in processes according to the present invention. Further, techniques for the formation of a tungsten-nitride ($W_xN$) copper interconnect barrier layer employing $W(CO)_6$ and conducted at a temperature in the range of 250° C. to 400° C., a pressure of approximately 100 milli-Torr to 50-Torr and with a $W(CO)_6$ flow rate in the range of 10 sccm to 20 sccm have also been demonstrated to provide a sidewall step coverage of greater than 30% in features with an aspect ratio of 4:1 and greater when utilized in processes according to the present invention.

In another embodiment, tungsten-containing copper interconnect barrier layer 20 is formed using a $WF_6$-based Atomic Layer Deposition (ALD) technique. In such a $WF_6$-based ALD technique, tungsten-containing copper interconnect barrier layer 20 is formed using an alternating exposure of thin TiN nucleation layer 12 to tungsten hexafluoride (WF6) and silane ($SiH_4$). Alternatively, the $WF_6$-based ALD technique can employ an alternating exposure of thin TiN nucleation layer 12 to $WF_6$ and $B_2H_6$. These $WF_6$-based ALD techniques can be conducted, for example, at a temperature in the range of 200° C. to 400° C. and a pressure in the range of 0.1 Torr to 50 Torr. The phrase "alternating exposure" refers to a process sequence wherein (a) thin TiN nucleation layer 12 is initially exposed to $WF_6$; (b) the $WF_6$ is purged from the reactor in which the $WF_6$-based ALD technique is being conducted; (c) the thin TiN nucleation layer (which has been exposed to $WF_6$) is exposed to $SiH_4$ (or $B_2H_6$); (d) the $SiH_4$ (or $B_2H_6$) is purged from the reactor; and (e) steps (a) through (d) are then repeated as necessary to form the desired tungsten-containing copper interconnect barrier layer.

Tungsten-containing copper interconnect barrier layer 20 can be of any thickness that serves as a suitable diffusion barrier to copper. However, in order to accommodate copper interconnect structures with small feature sizes (e.g., trenches with a width of 0.30 microns or less), the combined thickness of thin TiN nucleation layer 12 and tungsten-containing copper interconnect barrier layer 20 (as measured on the sidewall of via and/or trench opening 18) can be, for example, in the range of 10 angstroms to 250 angstroms. Accordingly, to accommodate a thin TiN nucleation layer with a minimum thickness of 3 angstroms, the thickness of tungsten-containing copper interconnect barrier layer 20 alone is, for example, in the range of 7 angstroms to 247 angstroms.

Next, a copper interconnect layer 22 can be optionally deposited on tungsten-containing copper interconnect barrier layer 20 using conventional techniques (e.g., copper electroplating). See step 54 of FIG. 2 and the resultant structure illustrated in FIG. 1C.

Processes according to the present invention provide several benefits over conventional processes for the formation of a copper interconnect barrier layer. As noted in the Background section, conventional CVD methods that deposit a copper interconnect barrier layer (e.g., a $W_xN$ layer) directly onto a substrate have poor sidewall step coverage. One benefit of the present invention is the unexpected finding that preparing the substrate, by depositing a thin TiN nucleation layer thereon, facilitated the formation of a tungsten-containing copper interconnect barrier layer with a sidewall step coverage of greater than 30%. Sidewall step coverage can be further improved by forming the tungsten-containing copper interconnect barrier layer immediately after the deposition of the thin TiN nucleation layer and without exposing the thin TiN nucleation layer to atmospheric conditions (e.g., air at atmospheric pressure). A further benefit is that the presence of the thin TiN nucleation layer serves to improve the adhesion of the tungsten-containing copper interconnect barrier layer (e.g., a tungsten or tungsten-nitride copper interconnect barrier layer) to dielectric substrates. This is in sharp contrast to the relatively poor adhesion obtained by the conventional formation of a tungsten (W) or tungsten-nitride ($W_XN$) copper interconnect barrier layer directly on a dielectric substrate.

Figure 3:
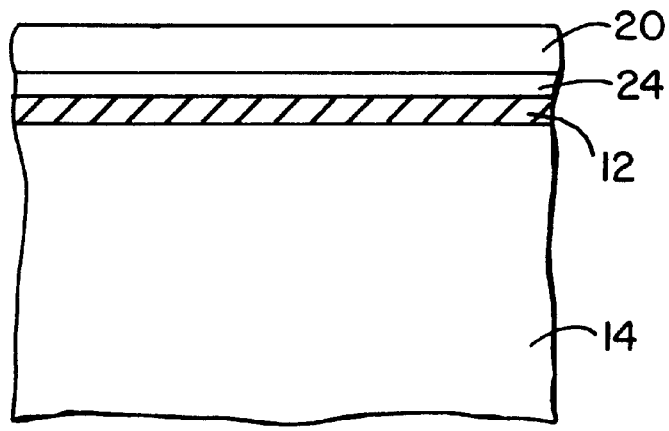
FIG. 3 is a cross-sectional diagram illustrating a resulting structure in a process according to another exemplary embodiment of the present invention.

In a process for forming a copper interconnect barrier layer on a substrate 10 according to another exemplary embodiment of the present invention, the formation of the tungsten-containing copper interconnect barrier layer 20 results in the simultaneous formation of a titanium-nitride-tungsten interfacial layer 24 between tungsten-containing copper interconnect barrier layer and dielectric layer 14. The resultant structure is illustrated in FIG. 3. This ternary titanium-nitride-tungsten interfacial layer 24 provides an additional barrier to the unwanted diffusion of copper.

The thickness and composition of titanium-nitride-tungsten interfacial layer 24 is dependent on the thickness of thin TiN nucleation layer 12 and the process conditions used to form the tungsten-containing copper interconnect barrier layer 20. However, when a W copper interconnect barrier layer is formed using $W(CO)_6$ at a temperature in the range of 300° C. to 500° C. or when a $W_XN$ copper interconnect barrier layer is formed using $W(CO)_6$ and $NH_3$ at a temperature in the range of 250° C. to 400° C., a titanium-nitride-tungsten interfacial layer will be formed.

Figure 4:
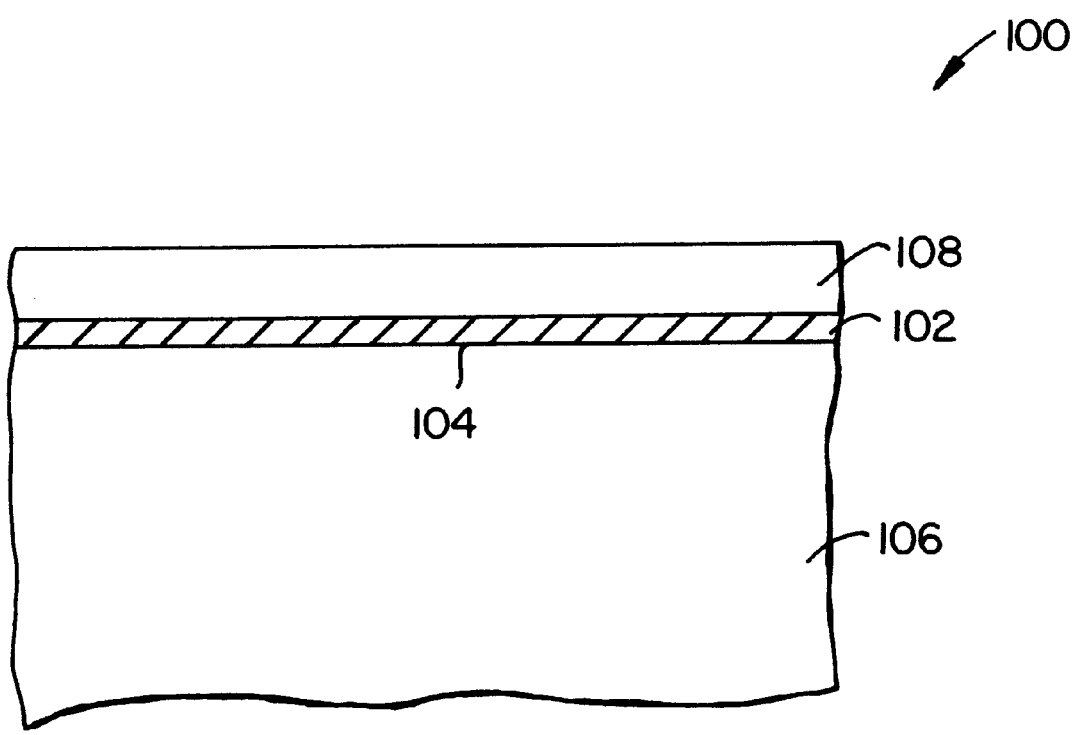
FIG. 4 is a cross-sectional diagram illustrating an exemplary embodiment of a structure according to the present invention.

FIG. 4 is a cross-sectional diagram illustrating an exemplary embodiment of a copper interconnect barrier layer structure 100 on a dielectric substrate according to the present invention. Copper interconnect barrier layer structure 100 includes a thin titanium-nitride (TiN) nucleation layer 102 disposed directly on the dielectric substrate 106. Thin TiN nucleation layer 102 can be formed using conventional techniques as described above in regard to FIGS. 1A–1C with a typical thickness in the range of 3 angstroms to 20 angstroms.

Copper interconnect barrier layer structure 100 also includes a tungsten-containing copper interconnect barrier layer 108 formed on thin TiN nucleation layer 102. Tungsten-containing copper interconnect barrier layer 108 can be formed, for example, using a CVD technique that employs a fluorine-free tungsten-containing gas (e.g., tungsten hexacarbonyl [$W(CO)_6$]) or a $WF_6$-based ALD deposition technique. Furthermore, tungsten-containing copper interconnect barrier layer 108 can be, for example, a tungsten (W) or tungsten-nitride ($W_XN$) copper interconnect barrier layer. Depending on the process conditions used to form the tungsten-containing copper interconnect barrier layer, copper interconnect barrier layer structure 100 can also include a titanium-nitride-tungsten interfacial layer (not shown in FIG. 4) between the thin TiN nucleation layer and the tungsten-containing copper interconnect barrier layer. This ternary interfacial layer serves as an additional barrier to the unwanted diffusion of copper. Since copper interconnect barrier layer structure 100 is produced by forming tungsten-containing copper interconnect barrier layer 108 on thin TiN nucleation layer 102, the sidewall step coverage for features (e.g., vias and/or trenches) in the dielectric substrate can be greater than 30%.

The gas flow rates recited and described above are optimized for deposition processes run in a CVD xZ chamber manufactured by Applied Materials and outfitted for 200 mm wafers. A person of ordinary skill in the art will recognize that the rates at which various precursor gases in the process are introduced are in part chamber specific and will vary if chambers or other design and/or volume are employed.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method for the formation of a copper interconnect barrier layer on a substrate comprising:

depositing one of a thin titanium-nitride nucleation layer and a thin tantalum-nitride nucleation layer on the substrate; and forming a tungsten-containing copper interconnect barrier layer overlying the substrate, wherein the forming step uses a Chemical Vapor Deposition (CVD) technique that employs a fluorine-free tungsten-containing gas.

2. The method of claim 1, wherein the forming step uses a CVD technique that employs tungsten hexacarbonyl as the fluorine-free tungsten-containing gas to form the tungsten copper interconnect barrier layer.

3. The method of claim 2, wherein the forming step uses a CVD technique conducted at a temperature in the range of 300° C. to 500° C. and a pressure in the range of 10 milli-Torr to 200 milli-Torr.

4. The method of claim 1, wherein the forming step forms a tungsten-nitride copper interconnect barrier layer.

5. The method of claim 4 wherein the depositing step deposits a thin titanium-nitride nucleation layer on the substrate.

6. The method of claim 5, wherein the forming step results in the formation of a titanium-nitride-tungsten interfacial layer between the tungsten-nitride copper interconnect barrier layer and the substrate.

7. The method of claim 4, wherein the forming step uses a CVD technique that employs tungsten hexacarbonyl and ammonia to from the tungsten-nitride copper interconnect barrier layer.

8. The method of claim 7, wherein the forming step uses a CVD technique conducted at a temperature in the range of 250° C. to 400° C. and a pressure of approximately 100 milli-Torr to 50 Torr.

9. A method for the formation of a copper interconnect barrier layer on a substrate comprising:

depositing one of a thin titanium-nitride nucleation layer and a thin tantalum-nitride nucleation layer on the substrate; and forming a tungsten-containing copper interconnect barrier layer overlying the substrate, wherein the forming step uses a WF6-based Atomic Layer Deposition (ALD) technique.

10. A method for the formation of a copper interconnect barrier layer on a substrate comprising:

depositing one of a thin tantalum-nitride nucleation layer and a thin titanium-nitride nucleation layer on the substrate; and forming a tungsten-containing copper interconnect barrier layer overlying the substrate using a Chemical Vapor Deposition (CVD) technique that employs tungsten hexacarbonyl.

11. A method for the formation of a copper interconnect barrier layer on a substrate comprising:

depositing one of a thin tantalum-nitride nucleation layer and a thin titanium-nitride nucleation layer on the substrate;

forming a tungsten-containing copper interconnect barrier layer overlying the substrate using a Chemical Vapor Deposition (CVD) technique that employs tungsten hexacarbonyl; and depositing a copper interconnect layer on the tungsten-containing copper interconnect barrier layer.

12. A method for the formation of a copper interconnect barrier layer on a substrate comprising:

depositing one of a thin tantalum-nitride nucleation layer and a thin titanium-nitride nucleation layer on the substrate; and forming a tungsten-containing copper interconnect barrier layer overlying the substrate using a $WF_6$-based Atomic Layer Deposition (ALD) technique.

13. A method for the formation of a copper interconnect barrier layer on a substrate comprising:

depositing one of a thin tantalum-nitride nucleation layer and a thin titanium-nitride nucleation layer on the substrate;

forming a tungsten-containing copper interconnect barrier layer overlying the substrate using a $WF_6$-based Atomic Layer Deposition (ALD) technique; and depositing a copper interconnect layer on the tungsten-containing copper interconnect barrier layer.

14. A method for the formation of a copper interconnect barrier layer on a substrate comprising:

depositing one of a thin tantalum-nitride nucleation layer and a thin titanium-nitride nucleation layer on the substrate;

forming a tungsten-containing copper interconnect barrier layer overlying the substrate using a $WF_6$-based Atomic Layer Deposition (ALD) technique conducted at a temperature in the range of 200° C. to 400° C. and a pressure in the range of 0.1 Torr to 50 Torr; and depositing a copper interconnect layer on the tungsten-containing copper interconnect barrier layer.

* * * * *